US012568631B2

(12) United States Patent
Thong et al.

(10) Patent No.: US 12,568,631 B2
(45) Date of Patent: Mar. 3, 2026

(54) THREE TERMINAL MEMORY CELLS AND METHOD OF MAKING THE SAME

(71) Applicant: GlobalFoundries Singapore Pte. Ltd., Singapore (SG)

(72) Inventors: Jia Rui Thong, Singapore (SG); Jianxun Sun, Singapore (SG); Eng Huat Toh, Singapore (SG); Juan Boon Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 1008 days.

(21) Appl. No.: 17/657,363

(22) Filed: Mar. 31, 2022

(65) Prior Publication Data
US 2023/0320104 A1      Oct. 5, 2023

(51) Int. Cl.
H10B 63/00      (2023.01)
H10N 70/00      (2023.01)

(52) U.S. Cl.
CPC .......... H10B 63/30 (2023.02); H10N 70/021 (2023.02); H10N 70/841 (2023.02)

(58) Field of Classification Search
CPC ...... H10B 63/30; H10N 70/021; H10N 70/24; H10N 70/8416; H10N 70/841–8418
See application file for complete search history.

(56) References Cited

U.S. PATENT DOCUMENTS

2017/0358743 A1*  12/2017  Kim ................... H10N 70/8822
2018/0062077 A1*   3/2018  Mukherjee ............. H10N 70/24

2018/0301626 A1*  10/2018  Trinh ................... H10N 70/841
2020/0106013 A1*   4/2020  Strutt ................... H10N 70/063
2021/0020834 A1*   1/2021  Loy ........................ H10B 63/30
2022/0037589 A1*   2/2022  Lee ........................ H10B 63/30
2023/0065500 A1*   3/2023  Lin ........................ H10N 70/24

FOREIGN PATENT DOCUMENTS

WO      2015199706 A1   12/2015

OTHER PUBLICATIONS

Liu et al., Dimensionally anisotropic graphene with high mobility and a high on-off ratio in a three-terminal RRAM device, Materials Chemistry Frontiers, 2020, pp. 1756-1763, vol. 4—Issue No. 6, The Royal Society of Chemistry and the Chinese Chemical Society 2020.
Huang et al., Three-terminal resistive switch based on metal/metal oxide redox reactions, Scientific Reports, 2017, pp. 1-7, vol. 7—Issue No. 7452, The Authors.

* cited by examiner

*Primary Examiner* — William B Partridge
*Assistant Examiner* — Chevy J Boegel
(74) *Attorney, Agent, or Firm* — David Cain

(57)      ABSTRACT

The disclosed subject matter relates generally to memory devices and a method of forming the same. More particularly, the present disclosure relates to three terminal resistive random-access (ReRAM) memory structures having two bottom electrodes and one top electrode. The present disclosure provides a structure including a first bottom electrode having an upper surface, a second bottom electrode having an upper surface, a switching layer on the upper surface of the first electrode and the upper surface of the second electrode, an oxygen enhancement layer on the switching layer, and a top electrode on the oxygen enhancement layer, the top electrode is positioned above the first bottom electrode and the second bottom electrode.

15 Claims, 4 Drawing Sheets

THREE TERMINAL MEMORY CELLS AND METHOD OF MAKING THE SAME

FIELD OF THE INVENTION

The disclosed subject matter relates generally to memory devices and a method of forming the same. More particularly, the present disclosure relates to three terminal resistive random-access (ReRAM) memory structures having two bottom electrodes and one top electrode.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

A ReRAM device includes a switching layer that is positioned between a bottom electrode and a top electrode. The ReRAM device can be programmed by changing the resistance across the switching layer to provide different content-storage states, namely a high-resistance state (HRS) and a low-resistance state (LRS), representing the stored bits of data. The switching layer can be modified by applying a programming voltage sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the resistive memory element to the high-resistance state. The content-storage state can be read by measuring a voltage drop across the resistive memory element after it is programmed.

SUMMARY

In an aspect of the present disclosure, there is provided a structure including a first bottom electrode having an upper surface, a second bottom electrode having an upper surface, a switching layer on the upper surface of the first electrode and the upper surface of the second electrode, an oxygen enhancement layer on the switching layer, and a top electrode on the oxygen enhancement layer, the top electrode is positioned above the first bottom electrode and the second bottom electrode.

In another aspect of the present disclosure, there is provided a method of forming a structure in a memory device by forming a first bottom electrode having an upper surface, forming a second bottom electrode having an upper surface, forming a switching layer on the upper surface of the first electrode and the upper surface of the second electrode, forming an oxygen enhancement layer on the switching layer, and forming a top electrode on the oxygen enhancement layer, the top electrode being formed above the first bottom electrode and the second bottom electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
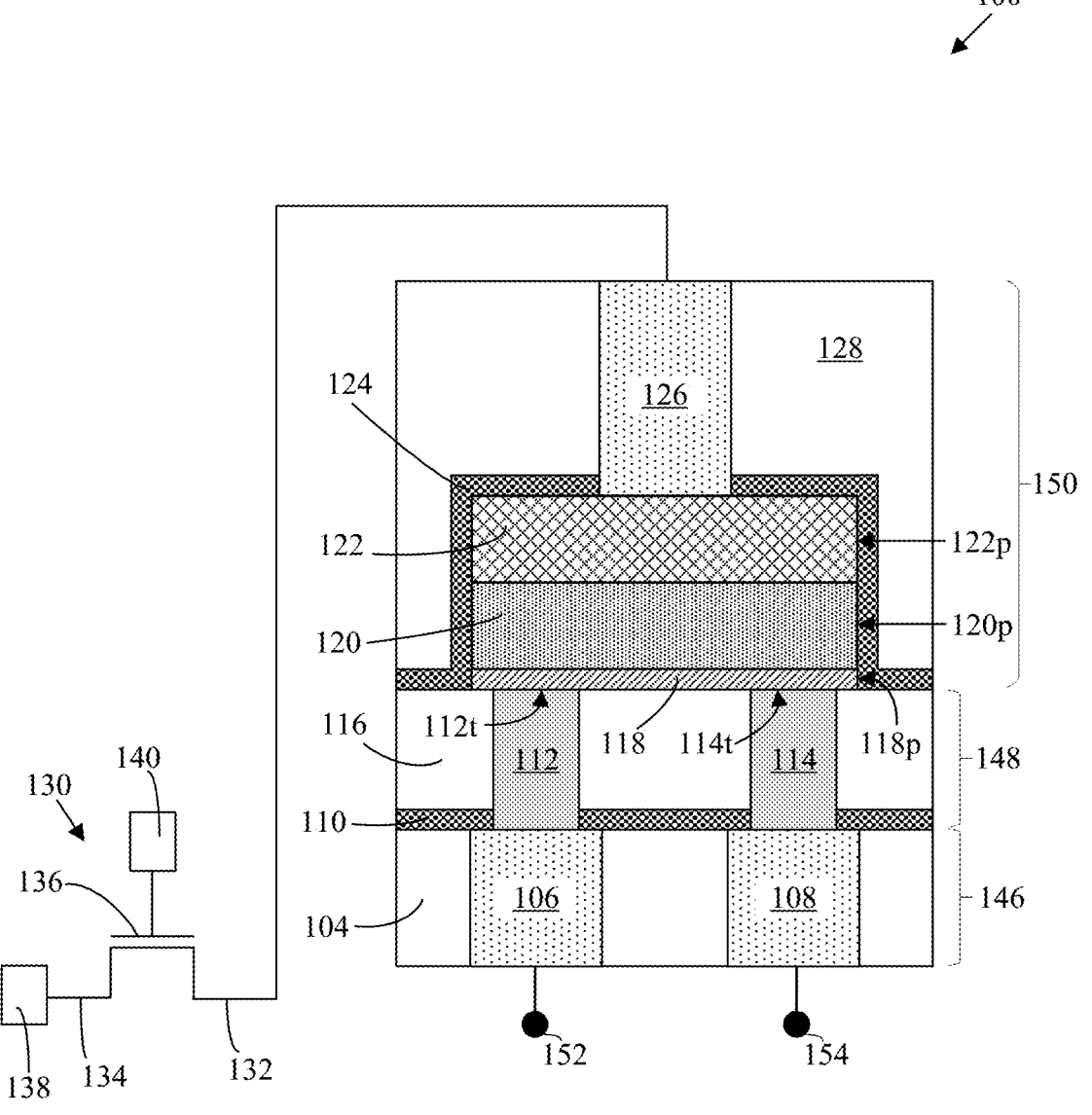
FIG. 1 is a cross-sectional view of an example structure for use in a memory device.

Referring to FIG. 1, an example structure 100 for use in a memory device may include a first bottom electrode 112, a second bottom electrode 114, a switching layer 118 positioned on or directly on the first bottom electrode 112 and the second bottom electrode 114, an oxygen enhancement layer 120 positioned on or directly on the switching layer 118, and a top electrode 122 positioned on or directly on the oxygen enhancement layer 120. The first bottom electrode 112, the second bottom electrode 114, the switching layer 118, the oxygen enhancement layer 120, and the top electrode 122 may provide a memory cell. The structure 100 may be formed above a substrate (not shown).

The first bottom electrode 112 may have an upper surface 112$t$ and the second bottom electrode 114 may have an upper surface 114$t$. The switching layer 118 may be positioned on or directly on the upper surface 112$t$ of the first bottom electrode 112 and the upper surface 114$t$ of the second bottom electrode 114. The switching layer 118 may be surrounded by a perimeter 118$p$. The switching layer 118, which may be fully surrounded by the perimeter 118$p$, may be shared by the first bottom electrode 112 and the second bottom electrode 114. The first bottom electrode 112 and the second bottom electrode 114 may be fully positioned inside a border or an edge defined by the perimeter 118$p$ of the switching layer 118.

The switching layer 118 may have a thickness in the range of about 5 nm to about 10 nm. The switching layer 118 may include carbon polymers, perovskites, silicon dioxide, a metal, or a metal oxide. Examples of the metal may include, but are not limited to, cobalt, tantalum, titanium, tungsten, hafnium, aluminum, of an alloy thereof. Examples of the metal oxide may include, but are not limited to, lanthanide oxides, tungsten oxide, copper oxide, cobalt oxide, silver oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. In embodiments where the switching layer 118 includes a metal, the metal may preferably be cobalt.

The terms "oxygen enhancement", "oxygen scavenging", "oxygen scavenger", or "oxygen exchange" may refer to a composition, layer, film, or material that can consume, deplete, or react with oxygen ions from a given environment. The oxygen enhancement layer 120 may include a metal or a metal oxide. Examples of the metal oxides for the oxygen enhancement layer 120 may include, but are not limited to, gadolinium oxide, aluminum oxide ($Al_2O_3$), hafnium oxide ($HfO_2$), oxides of tungsten ($WO_x$), oxides of titanium ($TiO_x$), or oxides of tantalum ($Ta_nO_x$), where "x" may be an integer in the range of 2 to 5 and "n" may be 1 or 2. Examples of the metals for the oxygen enhancement layer 120 may include, but are not limited to, tantalum (Ta), titanium (Ti), tungsten (W), or hafnium (Hf). The oxygen enhancement layer 120 may include a different material from the switching layer 118 and the top electrode 122. In embodiments where the switching layer 118 is a metal, the oxygen enhancement layer 120 may preferably include gadolinium oxide. The oxygen enhancement layer 120 may be surrounded by a perimeter 120p. The perimeter 120p of the oxygen enhancement layer 120 may be the same as the perimeter 118p of the switching layer 118. The oxygen enhancement layer 120 may have a thickness in the range of about 10 nm to about 100 nm.

The top electrode 122 may be positioned above the first bottom electrode 112 and the second bottom electrode 114. In particular, the bottom electrodes 112, 114 may be positioned below the switching layer 118 while the top electrode 122 may be positioned above the switching layer 118. The top electrode 122 may be surrounded by a perimeter 122p. The perimeter 122p of the top electrode 122 may be the same as the perimeter 118p of the switching layer 118. The top electrode 122 may have a thickness in the range of about 10 nm to about 100 nm. The top electrode 122, the first bottom electrode 112, and the second bottom electrode 114 may include a conductive material, such as tantalum, titanium, titanium nitride, tantalum nitride, or a combination thereof. In some embodiments, the top electrode 122, the first bottom electrode 112, and the second bottom electrode 114 may be copper-free (i.e., devoid of copper) or cobalt-free (i.e., devoid of cobalt). The first bottom electrode 112 and the second bottom electrode 114 may include a different material from the switching layer 118.

The structure 100 may include a first inter-level dielectric region 146, a second inter-level dielectric region 148 on the first inter-level dielectric region 146, and a third inter-level dielectric region 150 on the second inter-level dielectric region 148. The term "inter-level dielectric region" as used herein may refer to a region or a metallization level formed by the middle of line (MOL) or back end of line (BEOL) processing of an IC chip. The inter-level dielectric regions 146, 148, 150 may include a dielectric material 104, 116, 128, respectively. Examples of the dielectric material 104, 116, 128 in the respective inter-level dielectric regions 146, 148, 150 may include, but are not limited to, silicon dioxide, tetraethyl orthosilicate (TEOS), or a material having a chemical composition of $SiC_xO_yH_z$, wherein x, y, and z are in stoichiometric ratio. The inter-level dielectric regions 146, 148, 150 may include various interconnect features (e.g., interconnect vias, conductive lines, etc.). These interconnect features may provide routing or wiring of electrical signals and may connect various devices or components within the IC chip to perform desired functions.

The first inter-level dielectric region 146 may include a first conductive line 106 and a second conductive line 108.

The first bottom electrode 112 may be positioned on or directly on the first conductive line 106. The second bottom electrode 114 may be positioned on or directly on the second conductive line 108. The first conductive line 106 may be electrically connected or coupled to a first source line 152 and the second conductive line 108 may be electrically connected or coupled to a bit line 154.

The second inter-level dielectric region 148 may include the first bottom electrode 112, the second bottom electrode 114, and an etch stop layer 110. The etch stop layer 110 may be positioned over the first conductive line 106, the second conductive line 108, and positioned on the dielectric material 104 in the first inter-level dielectric region 146. The etch stop layer 110 may include, but are not limited to, silicon dioxide ($SiO_2$), silicon oxynitride (SiON), silicon nitride (SiN), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75.

The third inter-level dielectric region 150 may include the switching layer 118, the oxygen enhancement layer 120, and the top electrode 122. The third inter-level dielectric region 150 may also include an interconnect via 126 and a dielectric liner 124. The dielectric liner 124 may include, but are not limited to, silicon dioxide ($SiO_2$), silicon oxynitride (SiON), silicon nitride (SiN), Nitrogen doped silicon carbide (SiCN), $SiC_xH_z$ (i.e., BLoK™), or $SiN_wC_xH_z$ (i.e., NBLoK™) wherein each of w, x, y, and z independently has a value greater than 0 and less than 0.75. The dielectric liner 124 may include a different material from the switching layer 118 and the oxygen enhancement layer 120. The interconnect via 126 may be positioned on or directly the top electrode 122. The dielectric liner 124 may be positioned over the top electrode 122, the oxygen enhancement layer 120, and the switching layer 118. The dielectric liner 124 may at least surround the perimeter 118p of the switching layer 118, the perimeter 120p of the oxygen enhancement layer 120, and the perimeter 122p of the top electrode 122. For example, the dielectric liner 124 may be positioned on sides and upper surface of the top electrode 122, sides of the oxygen enhancement layer 120, and sides of the switching layer 118. The dielectric liner 124 may also be positioned on the dielectric material 116 in the second inter-level dielectric region 148. As shown in FIG. 1, the top electrode 122 may be positioned in a different inter-level dielectric region from the first bottom electrode 112 and the second bottom electrode 114. The first bottom electrode 112 and the second bottom electrode 114 may be positioned in the same inter-level dielectric region.

By positioning the bottom electrodes 112, 114 below the switching layer 118 and the top electrode 122 above the switching layer 118, it is found that electrical shorts between the top electrode 122 and the bottom electrodes 112, 114 can be prevented. Additionally, having the dielectric liner 124 surround the perimeter 118p of the switching layer 118 may also prevent electrical shorts between the top electrode 122 and the bottom electrodes 112, 114. The positioning of the bottom electrodes 112, 114 below the switching layer 118 may also enable a smaller device footprint as compared to having the bottom electrodes 112, 114 being positioned laterally adjacent to the switching layer 118 or above the switching layer 118.

The structure 100 may include a transistor 130. The transistor 130 includes a gate 136, a source 134, and a drain 132. The transistor 130 may be coupled to the top electrode 122 through various interconnect features. In some embodiments, the drain 132 may be electrically connected or coupled to the top electrode 122, for example, through at least the interconnect via 126. In other embodiments, the source 134 may be electrically connected or coupled to the top electrode 122, for example, through at least the interconnect via 126. In embodiments where the drain 132 is electrically connected or coupled to the top electrode 122, the source 134 may be electrically connected or coupled to a second source line 138. In embodiments where the source 134 is electrically connected or coupled to the top electrode 122, the drain 132 may be electrically connected or coupled to the second source line 138. The gate 136 may be electrically connected or coupled to a word line 140. The second source line 138, the first source line 152, and the bit line 154 may be biased with voltages, which in turn provides different bias voltages to the respective top electrode 122, first bottom electrode 112, and second bottom electrode 114. The word line 140 may be biased with a voltage to control the bias voltage applied to the top electrode 122.

For example, a memory device using the structure 100 described herein may have set, reset, and read operations configured by different bias conditions of the word line 140, the second source line 138, the bit line 154, and the first source line 152. During the set and the reset operations, the top electrode 122 may be supplied with a negative bias to drive negative oxygen ions from the top electrode 122 towards the switching layer 118. The inclusion of the oxygen enhancement layer 120 between the top electrode 122 and the switching layer 118 may reduce the minimum energy for the oxygen ions to move from the top electrode 122 into the switching layer 118. Consequently, the number of oxygen ions in the switching layer 118 may be increased, which in turn may increase the oxidation state of the material in the switching layer 118. Conversely, the top electrode 122 may be supplied with a positive bias to pull negative oxygen ions away from the switching layer 118 and towards the top electrode 122. Consequently, the number of oxygen ions in the switching layer 118 may be decreased, which in turn may decrease the oxidation state of the material in the switching layer 118.

During the read operation, one of the bottom electrodes 112, 114 may be grounded while the other electrode may be supplied with a bias voltage. A lateral resistance between the two bottom electrodes 112, 114 may be measured or read. An increase in the oxidation state of the switching layer 118 may increase the resistance of the switching layer 118 while a decrease in the oxidation state of the switching layer 118 may decrease the resistance of the switching layer 118. The changes in the bias voltage on the top electrode 122 may therefore enable a controllable resistive nature of the switching layer 118 (e.g., switching between high-resistance and low-resistance states). Hence, the configuration of different bias conditions of the word line 140, the second source line 138, the bit line 154, and the first source line 152 during set, reset, and read operations may enable the programming of various resistance states (e.g., high-resistance and low-resistance states), which may be used to represent one or more bits of information.

Advantageously, by having the respective perimeters of the oxygen enhancement layer 120 and the top electrode 122 be the same as the perimeter of the switching layer 118, it is found that the surface area for which oxygen ions can move into and out of the switching layer 118 is maximized, thereby improving the switching control of the resistance states in the switching layer 118 and increasing the stability of the performance of the structure 100.

In an embodiment, the structure 100 may have exactly one interconnect via positioned on or directly on the top electrode 122. The structure 100 may also have exactly two bottom electrodes 112, 114.

FIGS. 2 through 7 show structures at successive fabrication stages of a processing method for fabricating an exemplary memory device.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 2:
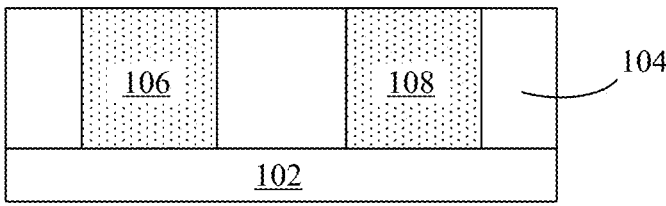
FIG. 2 through FIG. 7 are cross-sectional views depicting structures at successive fabrication stages of a processing method for fabricating an exemplary memory device.

Referring to FIG. 2, a dielectric material 104 may be formed on an interlayer dielectric 102 using the deposition techniques described herein. The dielectric material 104 may be patterned, using the patterning techniques described herein, to form trenches (not shown) in the dielectric material 104. The trenches in the dielectric material 104 may be filled with a conductive material to form a first conductive line 106 and a second conductive line 108. Formation of the conductive lines 106, 108 may be performed, for example, using the deposition techniques described herein and then planarized by chemical mechanical polishing (CMP).

Figure 3:
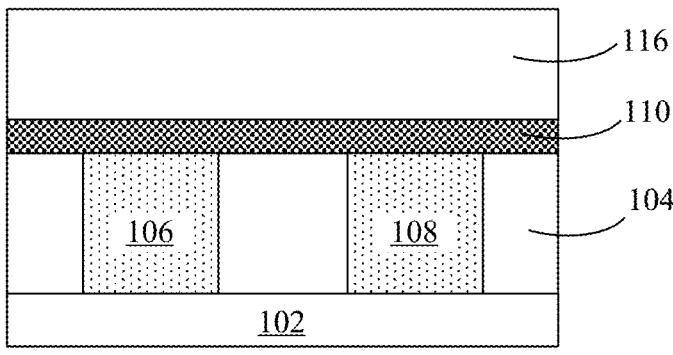
Figure 4:
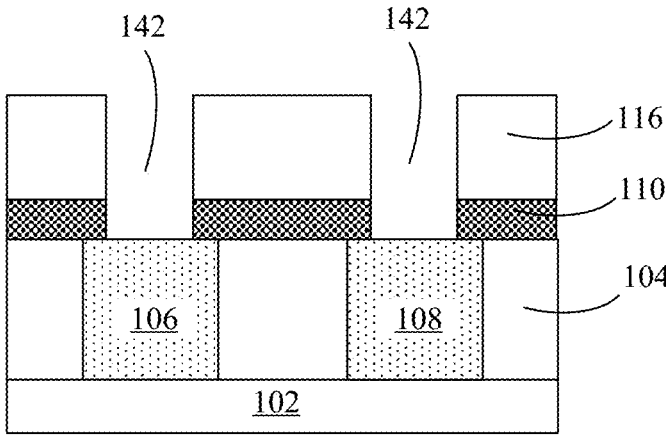

Referring to FIG. 3 and FIG. 4, an etch stop layer 110 may be formed on or directly on the dielectric material 104, the first conductive line 106, and the second conductive line 108. A dielectric material 116 may be formed on or directly on the etch stop layer 110. Formation of the etch stop layer 110 and the dielectric material 116 may be performed using the deposition techniques described herein. Thereafter, the etch stop layer 110 and the dielectric material 116 may be patterned, using the patterning techniques described herein, to form openings 142. The openings 142 may be vertically aligned over the conductive lines 106, 108. Formation of the openings 142 may also expose upper surfaces of the conductive lines 106, 108.

Figure 5:
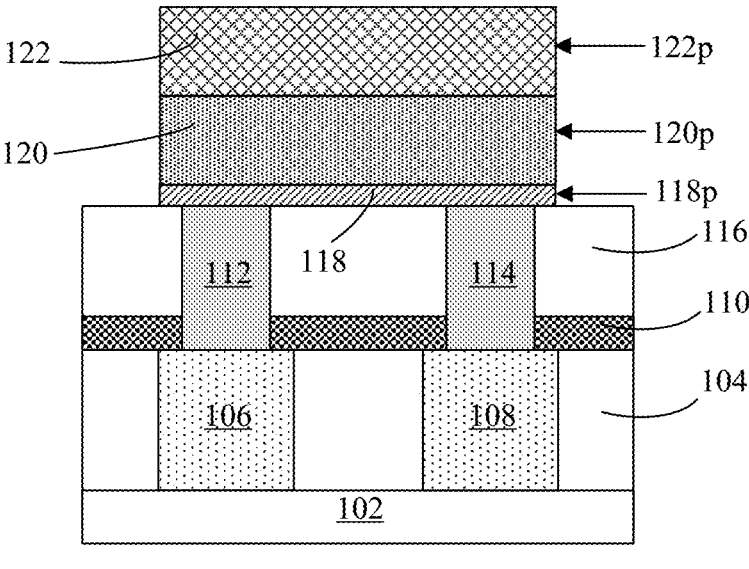

Referring to FIG. 5, the openings 142 in the etch stop layer 110 and the dielectric material 116 may be filled with conductive material to form a first bottom electrode 112 and a second bottom electrode 114. Formation of the bottom electrodes 112, 114 may be performed, for example, using the deposition techniques described herein and then planarized by chemical mechanical polishing (CMP). A switching layer 118 may be formed on or directly on the dielectric material 116 and the bottom electrodes 112, 114 using the deposition techniques described herein. An oxygen enhancement layer 120 may be formed on or directly on the switching layer 118 using the deposition techniques described herein. A top electrode 122 may be formed on or directly on the oxygen enhancement layer 120 using the deposition techniques described herein.

The switching layer 118, the oxygen enhancement layer 120, and the top electrode 122 may be patterned using the patterning techniques described herein to define respective perimeters 118p, 120p, 122p. As shown in FIG. 5, the switching layer 118 may be formed with a perimeter 118$p$, the oxygen enhancement layer 120 may be formed with a perimeter 120$p$, and the top electrode 122 may be formed with a perimeter 122$p$. The perimeter 120$p$ of the oxygen enhancement layer 120 and the perimeter 122$p$ of the top electrode 122 may be the same as the perimeter 118$p$ of the switching layer 118. As described herein, the first bottom electrode 112 and the second bottom electrode 114 may be fully positioned inside of the border established by the perimeter 118$p$ of the switching layer 118. The first conductive line 106 and the second conductive line 108 may extend horizontally (i.e., laterally) outside of, and beyond, the border established by the perimeter 118$p$ of the switching layer 118, which may facilitate connections of the conductive lines 106, 108 to peripheral circuits.

Figure 6:
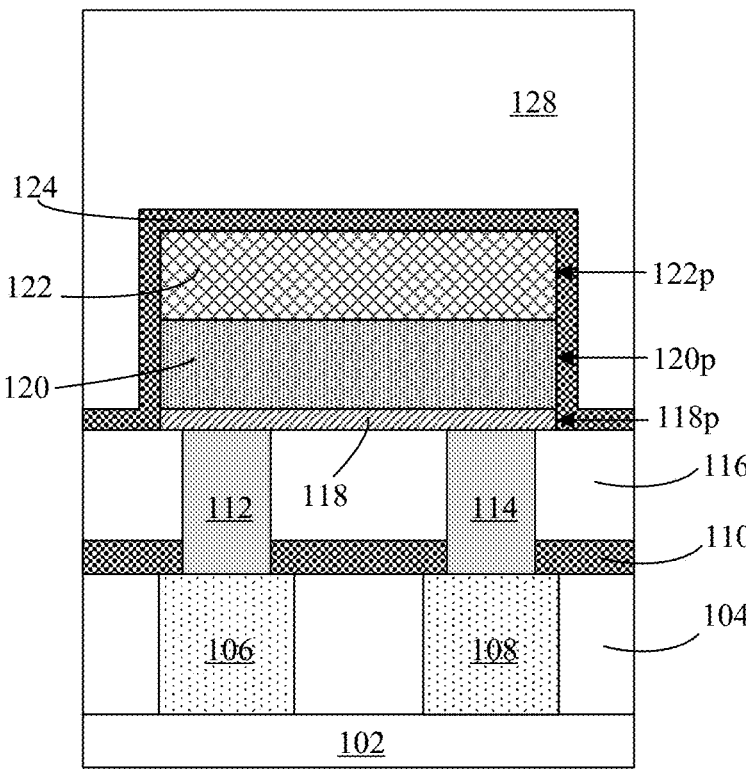

Referring to FIG. 6, a dielectric liner 124 may be formed over the switching layer 118, the oxygen enhancement layer 120, the top electrode 122, and the dielectric material 116 using the deposition techniques. Preferably, a conformal deposition process such as an ALD process or a highly conformal CVD process may be used to form the dielectric liner 124. The term "conformal" used herein may refer to a deposition technique in which the deposited material conforms to the contours of the surface or structure being deposited on. The deposited dielectric liner 124 may overlie sides and upper surface of the top electrode 122, sides of the oxygen enhancement layer 120, and sides of the switching layer 118 such that the dielectric liner 124 at least surrounds the perimeter 118$p$ of the switching layer 118, the perimeter 120$p$ of the oxygen enhancement layer 120, and the perimeter 122$p$ of the top electrode 122. A dielectric material 128 may be formed on the dielectric liner 124 using the deposition techniques described herein.

Figure 7:
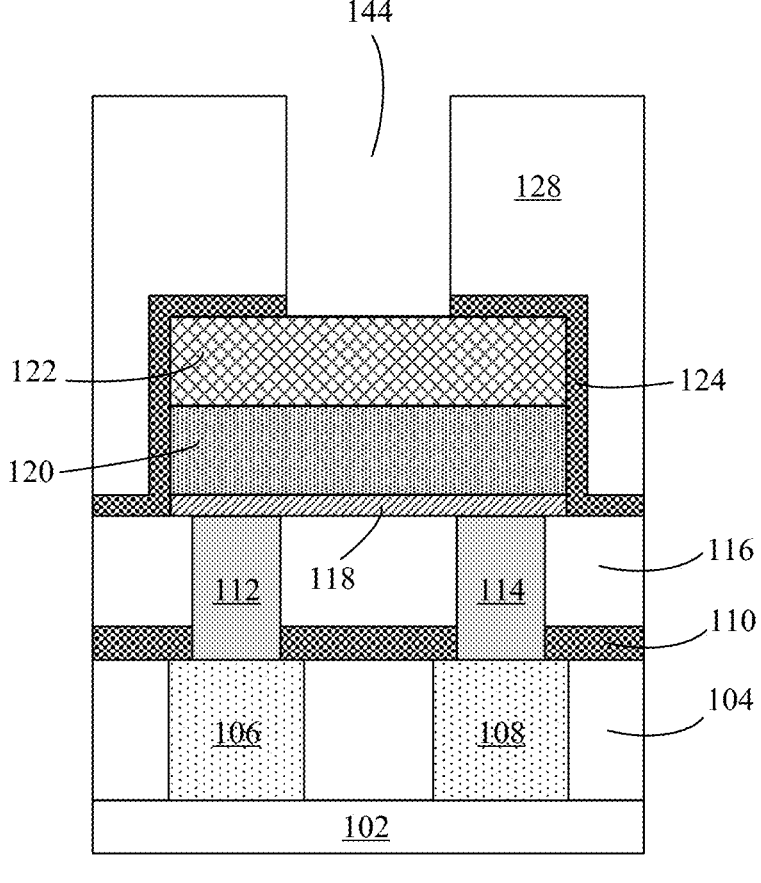

Referring to FIG. 7, an opening 144 may be formed in the dielectric material 128 using the patterning techniques described herein. The formation of the opening 144 may include performing an etch process to etch through the dielectric material 128 and the dielectric liner 124, and expose the top electrode 122. The structure in FIG. 7 may undergo further processing to form the structure in FIG. 1. For example, the opening 144 may be subsequently filled with a conductive material to form an interconnect via using the deposition techniques described herein.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A structure comprising:
   a first bottom electrode having an upper surface;
   a second bottom electrode having an upper surface;
   a switching layer on the upper surface of the first electrode and the upper surface of the second electrode;
   an oxygen enhancement layer on the switching layer;
   a top electrode on the oxygen enhancement layer, the top electrode is positioned over the first bottom electrode and the second bottom electrode;
   an interconnect via on the top electrode; and
   a transistor, the transistor includes a drain and a source, either the source or the drain is connected to the top electrode, wherein the drain is connected to the top electrode through the interconnect via.

2. The structure of claim 1, wherein the switching layer is shared by the first bottom electrode and the second bottom electrode.

3. The structure of claim 1, wherein the transistor includes a gate, and the gate is connected to a word line.

4. The structure of claim 1, further comprising a first dielectric region, the first dielectric region comprising a first conductive line and a second conductive line, wherein the first bottom electrode is on the first conductive line and the second bottom electrode is on the second conductive line.

5. The structure of claim 4, wherein the first conductive line is connected to a source line and the second conductive line is connected to a bit line.

6. The structure of claim 5, further comprising a dielectric liner positioned over the switching layer, the oxygen enhancement layer, and the top electrode.

7. The structure of claim 1, wherein the oxygen enhancement layer includes gadolinium oxide.

8. The structure of claim 7, wherein the switching layer includes copper.

9. The structure of claim 8, wherein the first bottom electrode and the second bottom electrode include tantalum, titanium nitride, tantalum nitride, or a combination thereof.

10. A method of forming a structure in a memory device, the method comprising:
    forming a first bottom electrode having an upper surface;
    forming a second bottom electrode having an upper surface;

forming a switching layer on the upper surface of the first electrode and the upper surface of the second electrode;

forming an oxygen enhancement layer on the switching layer;

forming a top electrode on the oxygen enhancement layer, the top electrode being formed over the first bottom electrode and the second bottom electrode;

forming an interconnect via on the top electrode; and forming a transistor, the transistor includes a drain and a source, either the drain or the source is connected to the top electrode, wherein the drain is connected to the top electrode through the interconnect via.

11. The method of claim 10, wherein the transistor is formed with a gate, the gate is connected to a word line.

12. The method of claim 11, further comprising:

forming a first dielectric region; and forming a first conductive line and a second conductive line in the first dielectric region, wherein the first bottom electrode is formed on the first conductive line and the second bottom electrode is formed on the second conductive line.

13. The method of claim 12, wherein the first conductive line is connected to a source line and the second conductive line is connected to a bit line.

14. The structure of claim 1, further comprising a dielectric region below the switching layer, the dielectric region comprising the first bottom electrode, the second bottom electrode, and a dielectric material laterally between the first bottom electrode and the second bottom electrode.

15. The method of claim 11, further comprising forming a second dielectric region on the first dielectric region, wherein the first bottom electrode, the second bottom electrode, and a dielectric material are formed in the second dielectric region, the dielectric material in the second dielectric region is laterally between the first bottom electrode and the second bottom electrode.

* * * * *